United States Patent
Yazawa et al.

(10) Patent No.: US 10,593,570 B2
(45) Date of Patent: Mar. 17, 2020

(54) SUBSTRATE HOLDING MODULE, SUBSTRATE PROCESSING APPARATUS, AND SUBSTRATE PROCESSING METHOD

(71) Applicant: Ebara Corporation, Tokyo (JP)

(72) Inventors: Akihiro Yazawa, Tokyo (JP); Kenichi Kobayashi, Tokyo (JP); Kenichi Akazawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 24 days.

(21) Appl. No.: 15/421,905

(22) Filed: Feb. 1, 2017

(65) Prior Publication Data

US 2017/0236727 A1  Aug. 17, 2017

(30) Foreign Application Priority Data

Feb. 12, 2016 (JP) .................. 2016-024620

(51) Int. Cl.
| | |
|---|---|
| H01L 21/67 | (2006.01) |
| H01L 21/687 | (2006.01) |
| B08B 1/00 | (2006.01) |
| B08B 11/02 | (2006.01) |

(52) U.S. Cl.
CPC .......... *H01L 21/67051* (2013.01); *B08B 1/00* (2013.01); *B08B 11/02* (2013.01); *H01L 21/67219* (2013.01); *H01L 21/67259* (2013.01); *H01L 21/68728* (2013.01)

(58) Field of Classification Search
None
See application file for complete search history.

(56) References Cited

U.S. PATENT DOCUMENTS

| | | | | |
|---|---|---|---|---|
| 6,168,665 B1* | 1/2001 | Sakai | ................ | H01L 21/67017 118/500 |
| 7,168,607 B2* | 1/2007 | Ehrke | ................... | H01L 21/187 228/207 |
| 2008/0047577 A1* | 2/2008 | Goto | ......................... | B08B 3/10 134/1 |
| 2012/0139192 A1* | 6/2012 | Ooi | ....................... | B25B 11/005 279/3 |

FOREIGN PATENT DOCUMENTS

| | | |
|---|---|---|
| JP | 2000-294616 A | 10/2000 |
| JP | 2004-327519 A | 11/2004 |
| JP | 2014-150178 A | 8/2014 |

\* cited by examiner

*Primary Examiner* — Eric W Golightly
*Assistant Examiner* — Arlyn I Rivera-Cordero
(74) *Attorney, Agent, or Firm* — Abelman, Frayne & Schwab

(57) ABSTRACT

According to the present disclosure, there is provided a substrate holding module that is capable of accommodating a substrate transferred by a transfer robot. The substrate holding module includes a pedestal including a holding mechanism configured to hold the substrate, a cover configured to cover the pedestal, and a moving mechanism configured to move the cover away from the pedestal.

14 Claims, 2 Drawing Sheets

SUBSTRATE HOLDING MODULE, SUBSTRATE PROCESSING APPARATUS, AND SUBSTRATE PROCESSING METHOD

CROSS-REFERENCE TO RELATED APPLICATIONS

This application is based on and claims priority from Japanese Patent Application No. 2016-024620, filed on Feb. 12, 2016, with the Japan Patent Office, the disclosure of which is incorporated herein in its entirety by reference.

TECHNICAL FIELD

The present disclosure relates to a substrate holding module, a substrate processing apparatus, and a substrate processing method.

BACKGROUND

As a substrate processing apparatus, there has been known a semiconductor polishing apparatus that flattens a surface of a semiconductor wafer. In addition, there has been known a backside polishing apparatus that polishes the backside of a semiconductor wafer (see, e.g., Japanese Patent Laid-Open Publication No. 2014-150178). In the above-mentioned substrate processing apparatuses, a temporary placing table (substrate holding module) that temporarily holds a substrate may be used in the middle of a substrate polishing processing and a cleaning processing after the polishing. In addition, when a substrate is transferred among a plurality of substrate transfer robots, the substrate may be temporarily placed on the temporary placing table and transferred between different robots.

SUMMARY

According to a first aspect of the present disclosure, there is provided a substrate holding module capable of accommodating a substrate transferred by a transfer robot. The substrate holding module includes a pedestal having a holding mechanism configured to hold a substrate thereon, a cover configured to cover the pedestal, and a moving mechanism configured to move the cover away from the pedestal.

The foregoing summary is illustrative only and is not intended to be in any way limiting. In addition to the illustrative aspects, embodiments, and the features described above, further aspects, embodiments, and features will become apparent by reference to the drawings and the following detailed description.

DETAILED DESCRIPTION

Figure 1:
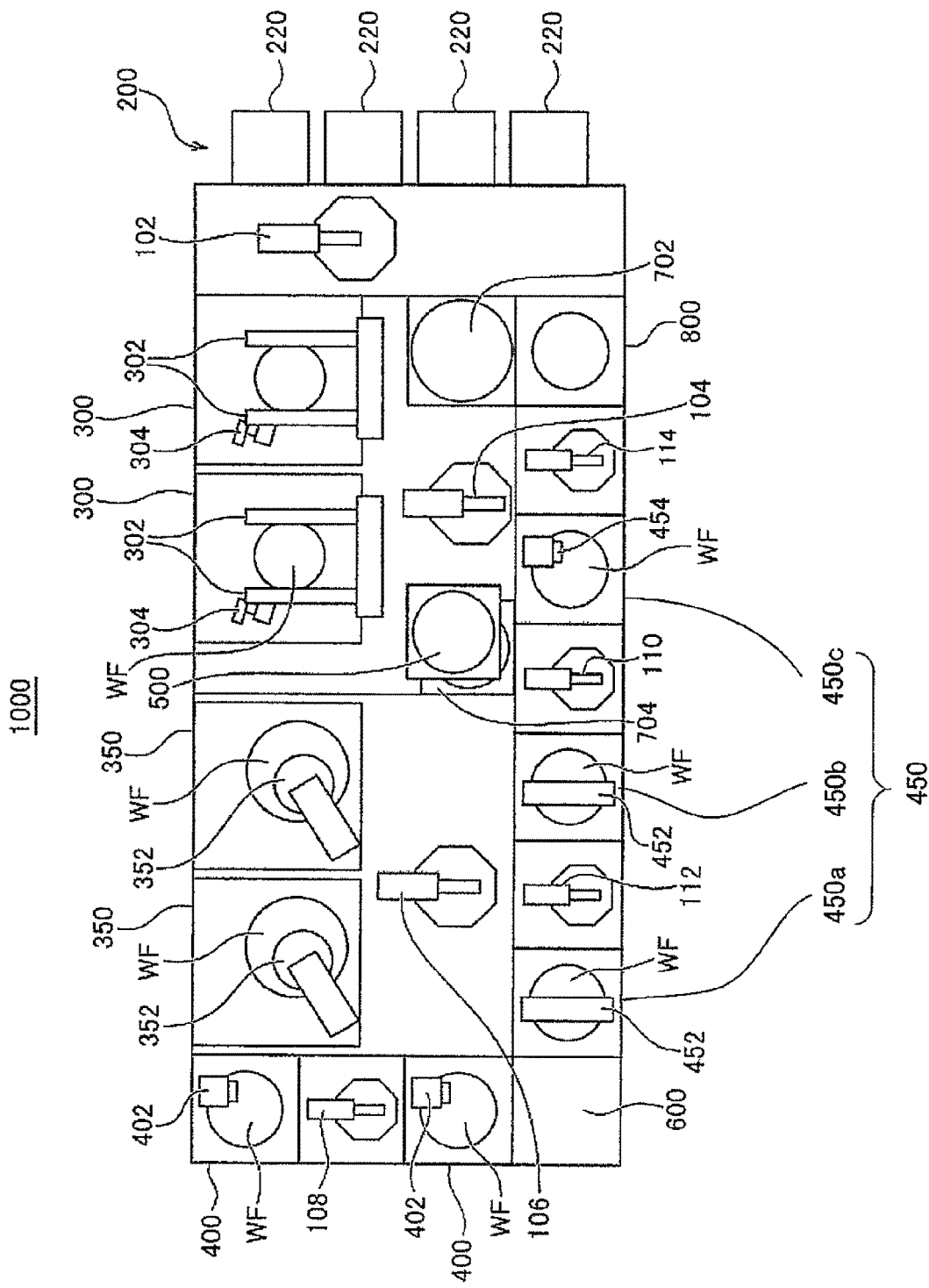
FIG. 1 is a schematic plan view illustrating a substrate processing apparatus according to an exemplary embodiment.

In the following detailed description, reference will be made to the accompanying drawings, which form a part hereof. The exemplary embodiments described in the detailed description, drawings, and claims are not meant to be limiting. Other embodiments may be utilized, and other changes may be made without departing from the spirit or scope of the subject matter presented here.

A conventional temporary placing table is surrounded by a housing to be unitized (see, e.g., Japanese Patent Laid-Open Publication Nos. 2004-327519 and 2000-294616). In such a temporary placing table, an opening is formed at a specific location of the housing to load/unload a substrate. Therefore, the approach path of a hand of a transfer robot for loading/unloading a substrate is limited to a certain direction. Further, a shutter may be provided in order to open/close the opening of the housing of the temporary placing table. When the temporary placing table includes a plurality of openings for loading/unloading a substrate, each opening may be provided with a shutter. Therefore, the structure of the temporary placing table becomes complicated and the size of the substrate placing table is increased.

The present disclosure at least partially solves at least some of the above-mentioned problems.

According to a first exemplary embodiment, there is provided a substrate holding module that is capable of accommodating a substrate transferred by a transfer robot. The substrate holding module includes a pedestal including a holding mechanism configured to hold a substrate thereon, a cover configured to cover the pedestal, and a moving mechanism configured to move the cover away from the pedestal.

According to a second exemplary embodiment, the substrate holding module according to the first exemplary embodiment further includes a rotary mechanism configured to rotate the pedestal.

According to a third exemplary embodiment, in the substrate holding module according to the first or second exemplary embodiment, the holding mechanism includes a substrate holding pin.

According to a fourth exemplary embodiment, the substrate holding module according to any one of the first to third exemplary embodiments further includes a nozzle configured to supply a liquid to one surface or both surfaces of the substrate in a state where the substrate is held by the holding mechanism.

According to a fifth exemplary embodiment, the substrate holding module according to the fourth exemplary embodiment further includes a drainage mechanism configured to discharge a liquid.

According to a sixth exemplary embodiment, there is provided a substrate processing apparatus. The substrate processing apparatus includes a substrate holding module according to any one of the first to fifth exemplary embodiments and a plurality of robots configured to covey a substrate to the substrate holding module.

According to a seventh exemplary embodiment, there is provided a substrate processing method. The substrate processing method includes: opening a cover of a substrate holding module; placing a substrate on a substrate holding pin disposed within the cover; closing the cover; and opening the cover to transfer the substrate placed on the substrate holding pin to the next process.

According to an eighth exemplary embodiment, the substrate processing method according to the seventh exemplary embodiment further includes: detecting whether or not a substrate is present within the substrate holding module; and supplying a liquid to a frontside and/or a backside of the substrate when it is detected that a substrate is present within the substrate holding module.

Hereinafter, exemplary embodiments of a substrate processing apparatus that includes a substrate holding module according to the present disclosure will be described with reference to the accompanying drawings. In the accompanying drawings, the same or similar elements will be denoted by the same or similar reference numerals, and duplicate descriptions of the same or similar elements in the description of each exemplary embodiment may be omitted. In addition, the features illustrated in the respective exemplary embodiments may be applied to other exemplary embodiments as long as they do not contradict each other.

<Substrate Processing Apparatus>

FIG. 1 is a plan view illustrating a backside polishing apparatus 1000 as an example of a substrate processing apparatus. The backside polishing apparatus 1000 is an apparatus that polishes the backside of a semiconductor substrate WF. In this specification, the backside of the substrate refers to a surface opposite to the frontside on which a device and a wiring (circuit) are formed. The backside polishing apparatus 1000 includes a loading/unloading unit 200, an edge polishing unit 300, a backside polishing unit 350, a backside cleaning unit 400, and a frontside cleaning unit 450. In addition, the backside polishing apparatus 1000 includes a power supply board 600 configured to supply power that is a power source for various operations of the units, and a control unit (not illustrated) configured to control various operations of the units. Hereinafter, the loading/unloading unit 200, the edge polishing unit 300, the backside polishing unit 350, the backside cleaning unit 400, and the frontside cleaning unit 450 will be described following the flow of a substrate in the backside polishing apparatus 1000.

<Loading/Unloading Unit>

The loading/unloading unit 200 is a unit that carries a substrate WF between a FOUP and a process unit. The loading/unloading unit 200 includes a plurality of (four (4) in the present exemplary embodiment) front loading units 220. Each front loading unit 220 is equipped with a cassette to stock a substrate WF.

The loading/unloading unit 200 includes a transfer robot 102. The transfer robot 102 takes out a substrate WF, before processings such as, for example, polishing and cleaning, are performed thereon, from the cassettes of the front loading units 220, and places the substrate WF on a temporary placing table 702.

<Edge Polishing Unit>

The substrate WF placed on the temporary placing table 702 is transferred to the edge polishing unit 300 via a transfer machine 302 by a transfer robot 104. The edge polishing unit 300 refers to a device that polishes the peripheral portion (including the peripheral edge area) of a substrate WF. The edge polishing unit 300 polishes the peripheral portion of the substrate WF using a polishing tape. Although the backside polishing apparatus 1000 in FIG. 1 includes two edge polishing units 300, any number of edge polishing units 300 may be provided in other exemplary embodiments.

The substrate WF on which the peripheral edge polishing has been performed by the edge polishing unit 300 is received again by the transfer robot 104 and placed on a temporary placing table (substrate holding module) 500 by the transfer robot 104. The detailed structure of the temporary placing table 500 will be described later.

<Backside Polishing Unit>

The substrate WF placed on the temporary placing table 500 is reversed by a transfer robot 106, and then transferred to the backside polishing unit 350. The backside polishing unit 350 refers to a unit that polishes the backside of a substrate WF. The backside polishing unit 350 polishes the backside of the substrate WF held on a stage by using a backside polishing head 352 that holds a polishing tape. Although the backside polishing apparatus 1000 of FIG. 1 includes two backside polishing units 350, any number of backside polishing units 350 may be provided in other exemplary embodiments.

<Backside Cleaning Unit>

When the backside polishing is terminated, the transfer robot 106 receives the substrate WF again from the backside polishing unit 350. The transfer robot 106 places the received substrate WF on a temporary placing table (not illustrated), and a transfer robot 108 receives the substrate WF, and transfers the substrate WF to one of the two backside cleaning units 400. The backside cleaning unit 400 refers to a unit that cleans the backside of a substrate. In one exemplary embodiment, the backside cleaning unit 400 may be a pen cleaning unit that cleans the substrate WF by pressing a rotating pencil sponge 402 against the backside of the substrate and oscillating the rotating pencil sponge 402 in the radial direction of the substrate WF. Further, the backside cleaning unit 400 is provided with a two-fluid jet nozzle for spraying a two-fluid jet formed of a mixed fluid of a liquid (for example, pure water) and a gas toward the backside of the substrate to clean the substrate WF. Although the backside polishing apparatus 1000 in FIG. 1 includes two backside cleaning units 400, any number of backside cleaning units 400 may be provided in other exemplary embodiments.

<Frontside Cleaning Unit>

When the cleaning of the backside of the substrate WF is completed, the transfer robot 108 receives again the substrate WF from the backside cleaning unit 400, and places the substrate WF on a temporary placing table (not illustrated). Thereafter, the transfer robot 106 receives the substrate WF from the temporary placing table, reverses the front and backsides of the substrate WF, and then places the substrate WF on a temporary placing table 704. The temporary placing table 704 is disposed below the temporary placing table 500. The temporary placing table 500 and the temporary placing table 704 are installed independently of each other. The substrate WF placed on the temporary placing table 704 is received by a transfer robot 110, transferred to a transfer robot 112, and then transferred to a first frontside cleaning unit 450a. The first frontside cleaning unit 450a may be a roll cleaning unit that cleans the frontside of the substrate WF by pressing a rotating roll sponge 452 against the frontside of the substrate WF while supplying the cleaning liquid to the frontside of the substrate WF. The substrate WF cleaned by the first frontside cleaning unit 450a is transferred to a second frontside cleaning unit 450b by the transfer robot 112. The second frontside cleaning unit 450b may be a roll cleaning unit similarly to the first frontside cleaning unit 450a. The substrate WF cleaned by the second frontside cleaning unit 450b is transferred to a third frontside cleaning unit 450c by the transfer robot 110. The third frontside cleaning unit 450c may be a pen cleaning unit that is similar to the backside cleaning unit 400.

The substrate WF cleaned by the third frontside cleaning unit 450c is transferred to a drying unit 800 by a transfer robot 114. The drying unit 800 dries the cleaned substrate WF. The substrate WF dried by the drying unit 800 is received by the transfer robot 102 and returned to the front loading unit 220.

<Detailed Structure of Temporary Placing Table>

Hereinafter, the detailed structure of the temporary placing table 500 (a substrate holding module) will be described. In the backside polishing apparatus 1000 illustrated in FIG. 1, the temporary placing table 500 described below is a temporary placing table 500 on which the substrate WF is placed after the substrate WF of which the peripheral edge has been polished by the edge polishing unit 300 is received by the transfer robot 104.

Figure 2:
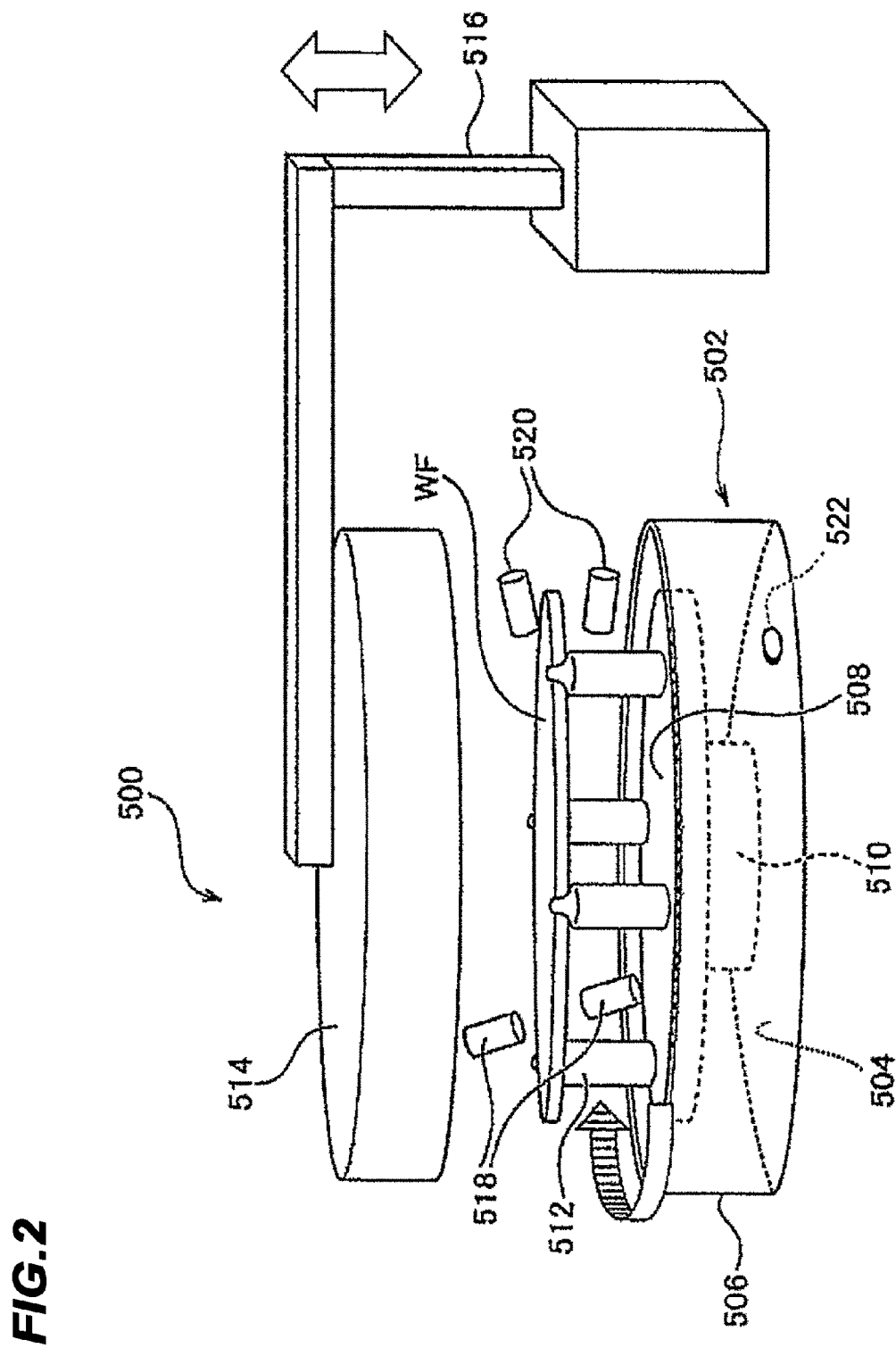
FIG. 2 is a view illustrating a configuration of a substrate holding module according to the exemplary embodiment.

FIG. 2 is a perspective view schematically illustrating a structure of the temporary placing table 500 according to one exemplary embodiment. As illustrated in FIG. 2, the temporary placing table 500 includes a bottom member 502. The bottom member 502 has a bottom surface 504 and a side wall 506 surrounding the outer periphery of the bottom surface 504. A pedestal 508 is disposed above the bottom surface 504. The pedestal 508 is rotatably supported by a rotary mechanism 510. The rotary mechanism 510 may be constituted with, for example, a motor, and a shaft. Four (4) pins 512 are attached to the pedestal 508 as a holding mechanism for holding a substrate. As illustrated in FIG. 2, the substrate WF is supported by the four pins at the outer peripheral portion thereof. The temporary placing table 500 illustrated in FIG. 2 includes four pins, but any number of pins may be used as long as the number is three or more. Alternatively, as another exemplary embodiment, a structure other than the pins may be used as a substrate holding mechanism. The pins 512 may be made of a resin. The pins 512 may be made of, for example, polyether ether ketone (PEEK), polytetrafluoroethylene (PTFE), or polyvinyl chloride (PVC).

The temporary placing table 500 illustrated in FIG. 2 is accessible from the transfer robots 104, 106 illustrated in FIG. 1, and the transfer robots 104, 106 are capable of placing a substrate WF on the temporary placing table 500, and in addition, the transfer robots 104 and 106 are capable of receiving a substrate WF from the temporary placing table 500.

The temporary placing table 500 illustrated in FIG. 2 includes an upper cover 514. The upper cover 514 is configured to completely cover the pedestal 508. In addition, the upper cover 514 may be made of a material having chemical resistance (e.g., a PVC resin). The upper cover 514 is connected to a moving mechanism 516 and is movable with respect to the bottom member 502 and the pedestal 508. The moving mechanism 516 may be a pneumatic moving mechanism that uses an air cylinder. The upper cover 514 comes in contact with the bottom surface 504 inside the side wall 506 of the bottom member 502 in a state where the upper cover 514 completely covers the pedestal 508. However, by making the lower edge of the upper cover 514 immersed in the liquid contained in the portion surrounded by the side wall 506 and the bottom surface 504, the upper cover 514 may be configured to water-seal the temporary placing table 500 without completely coming in contact with the bottom surface 504 of the bottom member 502. By configuring the upper cover 514 in this way, a space surrounded by the side wall 506 of the bottom member 502 and the upper cover 514 may function as a trap, for example, when the chemical liquid is supplied to the substrate WF, and the liquid may be stored on the bottom surface within the temporary placing table 500. The liquid stored on the bottom surface may be discharged from the temporary placing table 500 by a discharge mechanism to be described later. Therefore, it is possible to prevent the liquid used inside the temporary placing table 500 from scattering to the outside of the temporary placing table 500. In addition, when it is necessary to enhance the airtightness of the temporary placing table 500, for example, when it is not desired to discharge the chemical liquid supplied to the substrate WF so much to the outside of the system, a seal member such as, for example, a rubber packing may be provided at a portion where the upper cover 514 and the bottom member 502 are in contact with each other such that the interior of the temporary placing table 500 is sealed by the upper cover 514. Meanwhile, in a state where the upper cover 514 is moved upward by the moving mechanism 516, the upper cover 514 may completely expose the pins 512 such that the transfer robots 104 and 106 are accessible to the substrate WF. The upper cover 514 is not limited to a cylindrical shape as illustrated in FIG. 2, but may have another shape such as, for example, a rectangular cylindrical body.

Further, when the upper cover 514 is moved to the vicinity of the bottom surface within the temporary placing table 500, for example, the substrate WF may be placed on the temporary placing table 500 to be held by the pins 512. Then, a detection may be performed as to whether the substrate WF exists as described below, and then the upper cover 514 may start to be moved with respect to the bottom member 502 and the pedestal 508. Then, the upper cover 514 may be moved to a first position (e.g., at a position below the pedestal 508 and about 1 cm to 3 cm above the bottom surface 504) and may then be temporarily stopped (including a case in which the upper cover 514 is practically stopped). Then, the upper cover 514 may be moved to a second position that is a position near the bottom surface. In this way, when the upper cover 514 is moved to the vicinity of the bottom surface 504, it is possible to suppress the liquid accumulated on the bottom surface 504 from being scattered. Alternatively, it is possible to suppress the liquid existing on the bottom surface 504 from being scattered by moving the upper cover 514 to the first position at a first speed, which is a relatively high speed, without stopping the upper cover 514 at the first position, and then moving the upper cover 514 to the second position at a second speed, which is smaller than the first speed.

The temporary placing table 500 illustrated in FIG. 2 may include a detection mechanism 518 that detects the presence or absence of a substrate WF. Any detection mechanism (e.g., an optical detection mechanism) may be adopted as the detection mechanism 518. Further, the temporary placing table 500 is provided with a nozzle 520 that supplies a liquid to the front side and/or backside of the substrate WF held thereon. As illustrated, one nozzle 520 may be provided at each of the upper and lower sides with respect to the position at which the substrate WF is chucked. However, as another exemplary embodiment, a plurality of nozzles may be provided at each of the upper and lower sides with respect to the position at which the substrate is chucked, or the nozzles may be only provided at one of the upper and lower sides. Also, the number of nozzles at the upper side and the number of nozzles at the lower side may be different from each other. Pipes are connected to the nozzles 520 to supply various liquids such as, for example, pure water and a chemical liquid. Since the liquid can be supplied to the substrate WF by the nozzles 520 arranged in the temporary placing table 500, it is possible to suppress the substrate WF from being dried while the substrate WF is being processed. The temporary placing table 500 is provided with a drainage mechanism and an evacuation mechanism (not illustrated). By providing a drain port 522 on the bottom surface 504 as a drainage mechanism, the liquid supplied from the nozzles 520 onto the surface of the substrate WF may be discharged to the outside. Furthermore, as one exemplary embodiment, the nozzles 520 may be made movable, and the flow rate of the liquid injected from the nozzles 520 may be made controllable. In such a case, when no substrate WF is present in the temporary placing table 500, the entire interior of the temporary placing table 500 including the upper cover 514 and the pins 512 may be cleaned, and the waste liquid after cleaning may be discharged from the drain port of the bottom face 504. Further, by providing an evacuation mechanism in the temporary placing table 500, the contamination of the substrate on the temporary placing table 500 may be more effectively prevented.

In the temporary placing table 500 according to the above-described exemplary embodiment, a substrate WF placed thereon may be completely exposed by the upper cover 514. Therefore, the hand of a transfer robot is accessible to the substrate from all directions unlike a temporary placing table having an opening for loading/unloading a substrate which is formed in a specific place of the housing. Since there is a degree of freedom in access direction of the hand of a transfer robot, a plurality of robot hands are accessible to the temporary placing table. In addition, it is not required to provide a temporary placing table corresponding to each transfer robot in consideration of the access direction of the robot hand, and the entire space of the substrate processing apparatus may be effectively utilized. Further, since the pedestal 508 on which the pins 512 for holding the substrate WF are placed is rotatable, the pins 512 may be rotated to a position where the pins 512 do not interfere with the hands of the transfer robots 104, 106. Therefore, the degree of freedom increases in the access direction of the transfer robots to the substrate WF. In addition, since the substrate WF may be completely covered by the upper cover 514, it is possible to prevent the liquid supplied from the nozzles 520 above the position at which the substrate WF is chucked from being scattered. Further, by providing the nozzles 520 for supplying the liquid to the substrate WF on the temporary placing table, the drying of the substrate placed on the temporary placing table may be more effectively suppressed.

As another exemplary embodiment, the temporary placing table 500 of the above-described exemplary embodiments may be a temporary placing table in which the rotary mechanism is omitted. This is because a rotary mechanism is not always necessary unless the access direction from a transfer robot interferes with the pins of the temporary placing table. In another exemplary embodiment, when it is unnecessary to maintain the substrate WF in the wet state, it is possible to use a temporary placing table obtained by omitting the nozzles 520 for supplying a liquid from the temporary placing table 500 of the above-described exemplary embodiments.

The temporary placing table 500 described above is one of the temporary placing tables 500 in the backside polishing apparatus 1000 illustrated in FIG. 1. However, other temporary placing tables such as, for example, the temporary placing tables 702, 704 may have the same configuration. The other temporary placing tables 702, 704 may be different from the temporary placing table 500 described above, or may be any temporary placing table that has been conventionally used.

Further, the temporary placing table 500 described above may not be necessarily used in the backside polishing apparatus, and may be used in the other substrate processing apparatuses such as, for example, a bevel polishing apparatus, a CMP apparatus, and a substrate plating apparatus.

From the foregoing, it will be appreciated that various exemplary embodiments of the present disclosure have been described herein for the purpose of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising: a substrate holding module comprising a bottom member including a bottom surface and a side wall, the side wall extending upwardly from an outer periphery of the bottom surface and surrounding the outer periphery of the bottom surface, a pedestal disposed above the bottom surface and including a holder configured to hold a substrate, a cover configured to cover the pedestal, a moving mechanism configured to move the cover relative to the bottom surface, and a control unit that controls various operations of the substrate holding module, wherein the control unit is configured to control the moving mechanism to move the cover towards the bottom member to a first position,
   stop movement of the cover, and move the cover to a second position after stopping the movement of the cover, and wherein a bottom edge of the cover extends below the pedestal and above the bottom surface in the first position and the bottom edge of the cover contacts the bottom surface of the bottom member inside the side wall of the bottom member in the second position; and
   a plurality of robots transfers the substrate to the substrate holding module.

2. A substrate holding module comprising:
   a bottom member including a bottom surface and a side wall, the side wall extending upwardly from an outer periphery of the bottom surface and surrounding the outer periphery of the bottom surface;
   a pedestal disposed above the bottom surface and including a holder configured to hold a substrate;
   a cover configured to cover the pedestal;
   a moving mechanism configured to move the cover relative to the bottom surface; and
   a control unit that controls various operations of the substrate holding module,
   wherein the control unit is configured to control the moving mechanism to move the cover towards the bottom member to a first position at a first speed, stop movement of the cover, and move the cover to a second position at a second speed slower than the first speed after stopping the movement of the cover, and
   wherein a bottom edge of the cover extends below the pedestal and above the bottom surface in the first position and the bottom edge of the cover contacts the bottom surface of the bottom member inside the side wall of the bottom member in the second position.

3. The substrate holding module of claim 2, further comprising:
   a detector for detecting a presence or absence of the substrate on the substrate holder,
   wherein the control unit is configured to control the moving mechanism to move the cover to the first position when the detector detects the presence of the substrate on the substrate holder.

4. The substrate holding module of claim 2, wherein a distance between the bottom edge of the cover and the bottom surface in the first position is 1 to 3 cm.

5. A substrate holding module comprising:
   a bottom member including a bottom surface and a side wall, the side wall extending upwardly from an outer periphery of the bottom surface and surrounding the outer periphery of the bottom surface;

a pedestal disposed above the bottom surface and including a holder configured to hold a substrate;
a cover configured to cover the pedestal;
a moving mechanism configured to move the cover relative to the bottom surface; and
control unit that controls various operations of the substrate holding module,
wherein the control unit is configured to control the moving mechanism to move the cover towards the bottom member to a first position, stop movement of the cover, and move the cover to a second position after stopping the movement of the cover, and
wherein a bottom edge of the cover extends below the pedestal and above the bottom surface in the first position and the bottom edge of the cover contacts the bottom surface of the bottom member inside the side wall of the bottom member in the second position.

6. The substrate holding module of claim 5, wherein the holder includes at least one substrate holding pin.

7. The substrate holding module of claim 5, wherein a distance between the bottom edge of the cover and the bottom surface in the first position is 1 to 3 cm.

8. The substrate holding module of claim 5, further comprising:
a motor configured to rotate the pedestal.

9. The substrate holding module of claim 8, wherein the bottom member is stationary when the pedestal is rotated by the motor.

10. The substrate holding module of claim 5, further comprising:
a detector for detecting a presence or absence of the substrate on the substrate holder.

11. The substrate holding module of claim 10, wherein the control unit is configured to control the moving mechanism to move the cover to the first position when the detector detects the presence of the substrate on the substrate holder.

12. The substrate holding module of claim 5, further comprising:
at least one nozzle configured to supply a liquid to one surface or both surfaces of the substrate in a state where the substrate is held by the holder.

13. The substrate holding module of claim 12, further comprising:
a drain configured to discharge the liquid.

14. The substrate holding module of claim 12, wherein when the cover is moved by the moving mechanism to the second position, the cover together with the liquid supplied by the at least one nozzle and subsequently stored in the bottom member, functions as a trap.

* * * * *